United States Patent [19]
Connolly et al.

[11] Patent Number: 5,170,405
[45] Date of Patent: Dec. 8, 1992

[54] SEMICONDUCTOR DIODE LASER HAVING SMALLER BEAM DIVERGENCE

[75] Inventors: John C. Connolly, Monmouth Junction; Stephen L. Palfrey, Robbinsville, both of N.J.

[73] Assignee: Eastman Kodak Company, Rochester, N.Y.

[21] Appl. No.: 651,076

[22] Filed: Feb. 6, 1991

[51] Int. Cl.$^5$ .................................................. H01S 3/19
[52] U.S. Cl. ........................................ 372/48; 372/45; 372/96
[58] Field of Search .................... 372/48, 96, 44, 45, 372/46

[56] References Cited

U.S. PATENT DOCUMENTS

4,257,011  3/1981  Nakamura et al. ................. 331/94.5
5,027,368  6/1991  Kudo et al. ............................ 372/48

OTHER PUBLICATIONS

"1.3-um Distributed Feedback Laser Diode with a Gratting Accurately Controlled by a New fabrication Technique", published in *Journal of Lightwave Technology*, vol. 7, No. 12, Dec., 1989, pp. 2072-2076, by A. Takemoto et al.

B. Goldstein et al., "Efficient AlGaAs channeled-planar distributed feedback laser", published in *Applied Physics Letters*, vol. 53(7), Aug. 15, 1988, pp. 550-552.

N. Yoshida et al., "InGaAsP/InP DFB Laser with a new Grating Structure by MOCVD", published in *Proceedings of International Electron Devices Meeting* of Dec., 1988, pp. 307-310.

S. Takigawa et al., "Continuous room-temperature operation of a 759-nm GaAlAs distributed feedback laser", published in *Applied Physics letters*, vol. 51(20), Nov. 16, 1987, pp. 1580-1581.

*Primary Examiner*—James W. Davie
*Attorney, Agent, or Firm*—Mark Z. Dudley

[57] ABSTRACT

A distributed feed back semiconductor diode laser comprising a substrate of n-type conductivity gallium arsenide having a channel along one surface thereof between its end surfaces. A first clad layer of n-type gallium aluminum arsenide is on the surface of the substrate. The first clad layer fills the channel and has a planar surface. A thin active layer of undoped aluminum gallium arsenide is on the first clad layer and a spacer layer of p-type conductivity aluminum gallium arsenide is on the active layer. A grating layer of p-type conductivity aluminum gallium arsenide is on the spacer layer and has a second order grating therein which extends across the channel in the substrate. A second clad layer of p-type conductivity aluminum gallium arsenide is on the grating layer and a cap layer of n-type conductivity gallium arsenide is on the second clad layer. A p-type conductivity contact region extends through the cap layer to the second contact layer and is over the channel in the substrate. Conductive contacts are on the contact region and a second surface of the substrate. The composition and thicknesses of the active layer, spacer layer and grating layer are such as to provide the output beam of the diode laser with a relatively low divergence angle of about 27°.

19 Claims, 2 Drawing Sheets

SEMICONDUCTOR DIODE LASER HAVING SMALLER BEAM DIVERGENCE

FIELD OF THE INVENTION

The present invention relates to a semiconductor diode laser, and, more particularly, to a distributed feedback, channeled substrate, planar semiconductor diode laser.

BACKGROUND OF THE INVENTION

It has been found desirable to have a high-power index-guided diode laser operating in a wavelength-locked single longitudinal mode and with a well defined single lateral spatial mode. Such diode lasers have applications in space communications, optical recording and fiber-optics. To achieve such a diode laser, a channeled substrate planar (CSP) AlGaAs diode laser was developed. Such a diode laser has a channel in the substrate for lateral confinement and a clad layer over the substrate and filling the channel. The clad layer has a planar surface over which the active layer of the diode laser is grown epitaxially. This type of diode laser has all of the above desired properties except spectral stabilization.

In order to achieve both spectral and spatial stability, a channel substrate, planar, distributed-feedback diode laser was developed. Such a diode laser is described in an article entitled "Efficient AlGaAs channeled-substrate-planar-distributed feedback laser" by B. Goldstein et al., *APPLIED PHYSICS LETTERS*, Vol. 53(7), Aug. 15, 1988, pages 550–552. This diode laser includes a grating to achieve spectral stability. The grating shown in this article is an interrupted grating in that it is positioned in the wings or shoulders of the device on either side of a V-channel in the substrate. Although the structure displays distributed feedback characteristics and the desired spatial stabilization, the devices exhibit distributed feedback behavior only over a limited temperature range (<10° C.) and the yield of the devices having these desired characteristics is very low (less than about 5%). The reason for this is that the optical mode only couples to the grating over the wings or shoulders of the device and thereby provides a very low coupling coefficient, which describes the extent of the interaction between the optical field of the diode laser and the grating.

To enhance the interaction between the grating and the optical field, it has been suggested that the grating be positioned in the structure such that a greater portion of the optical mode interacts with the grating. Diode lasers having confined channels with a grating extending across the entire device are shown in U.S. Pat. No. 4,257,011 (M. Nakamura et al.), issued Mar. 17, 1981, and entitled "Semiconductor Laser Diode" and in an article entitled "Continuous room-temperature operation of a 759-nm GaAlAs distributed feedback laser" by S. Takigawa et al., *APPLIED PHYSICS LETTERS*, Vol. 51(20), Nov. 16, 1987, pages 1580–1581. Although this structure greatly increases the coupling coefficient, it also provides a large beam divergence of the emitted beam (as large as 50°). Such a beam divergence is undesirable for most applications requiring coupling to optical systems. A smaller beam divergence in the range of about 25° to 29° allows for more efficient use of the light output from the diode laser with a simple optical system.

It is desirable to have a semiconductor diode laser which not only has a high coupling coefficient for larger temperature ranges of stable single spatial and longitudinal mode operation and high yield, but also has a small beam divergence.

SUMMARY OF THE INVENTION

The present invention relates to a semiconductor diode laser having a channeled substrate, planar structure with a grating across at least the channel for distributed feedback operation over a relatively wide temperature range, but which also includes means for achieving spatial stability, relatively high yield and small beam divergence. This is achieved by a diode laser having over the channeled substrate, first and second clad layers of opposite conductivity type, an active layer between the clad layers, a grating over the channel between the active layer and one of the clad layers, and a spacer layer between the active layer and the grating. The thicknesses and composition of the active layer, spacer layer and grating layer are such as to provide the small beam divergence at a high coupling coefficient between the optical field and the grating.

More particularly, the semiconductor diode laser includes a substrate of a semiconductor material of one conductivity type having first and second opposed surfaces and a channel in the first surface. A first clad layer of a semiconductor material of the one conductivity type is on the first surface of the substrate. The first clad layer fills the channel and has a planar surface. An active layer of a semiconductor material is on the first clad layer. A spacer layer of a semiconductor material of the opposite conductivity type is on the active layer and a grating layer of a semiconductor material of the opposite conductivity type is over the spacer layer. The grating layer has a grating therein which extends laterally across at least the channel in the substrate. A second clad layer of a semiconductor material of the opposite conductivity type is on the grating layer. The thicknesses and composition of the active layer, spacer layer and grating layer being such as to provide a beam divergence of the light beam emitted from the diode laser in a range of about 25° to 29°.

The invention will be better understood from the following more detailed description taken with the accompanying drawings.

It should be understood that the drawings are not necessarily drawn to scale.

DETAILED DESCRIPTION

Figure 1:
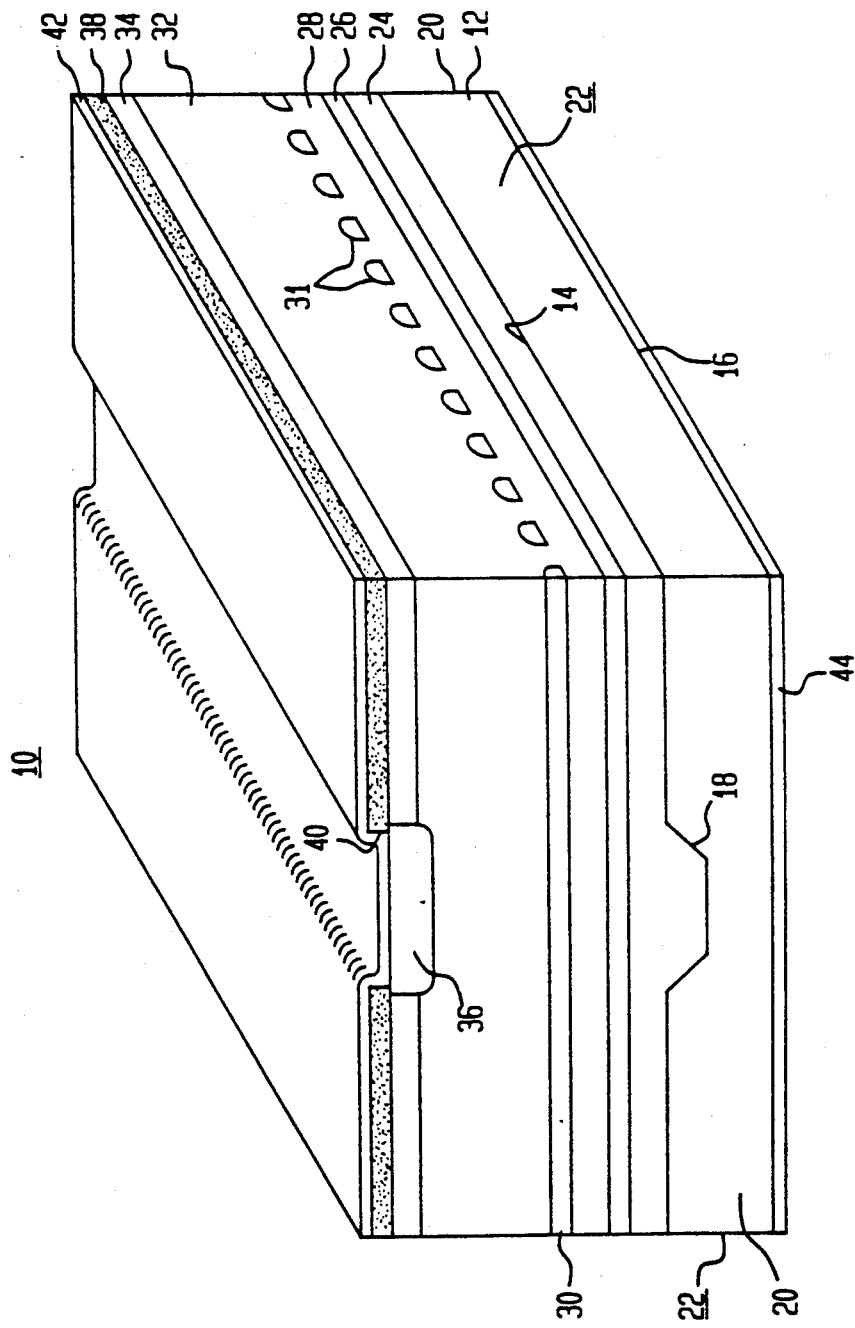
FIG. 1 is a perspective view of a semiconductor diode laser in accordance with the present invention.

Referring to FIG. 1, there is shown a perspective view of the semiconductor diode laser 10 in accordance with the present invention. Diode laser 10 comprises a substrate 12 of a semiconductor material of one conductivity type, preferably silicon doped, n-type conductivity gallium arsenide (GaAs), having first and second opposed major surfaces 14 and 16. A channel 18 having a flat bottomed V is in substrate 12 and extends to the major surface 14. The channel 18 is about 5 micrometers wide and about 1 micrometer deep. The channel 18 extends longitudinally along the substrate 12 between end surfaces 20 thereof and intermediate side surfaces 22 of the substrate 12.

On the first major surface 14 of the substrate is a first clad layer 24 of a semiconductor material of the one conductivity type (preferably n-type conductivity aluminum gallium arsenide, $Al_{0.34}Ga_{0.66}As$, which is doped with Sn to a level of $1 \times 10^{18}$ impurities/cm$^3$). The first clad layer fills the channel 18 and has a planar surface. The first clad layer preferably has a thickness of about 1.3 micrometers in the channel 18 and 0.3 micrometers over the shoulder or winged regions of the substrate on each side of the channel 18. A thin active layer 26 is over the first clad layer 24. The active layer 26 is of undoped semiconductor material, preferably $Al_{0.06}Ga_{0.94}As$, having a nominal thickness of 0.05 micrometers. This material has a residue background doping which is normally n-type conductivity at a doping level of $5 \times 10^{16}$ impurities/cm$^3$. A spacer layer 28 of p-type semiconductor material (preferably $Al_{0.34}Ga_{0.66}As$ doped with Ge to a level of about $5 \times 10^{17}$ impurities/cm$^3$) is on the active layer 26. The spacer layer 28 has a nominal thickness of about 0.15 to 0.2 micrometers.

On the spacer layer 28 is a grating layer 30 of p-type conductivity semiconductor material (preferably $Al_{0.20}Ga_{0.80}As$ doped with Ge to a level of $5 \times 10^{17}$ impurities/cm$^3$). The grating layer 30 has a nominal thickness of about 0.05 micrometers. A second order grating having a period of about 2400 Angstroms is in the grating layer 30. The grating is formed by spaced, parallel grooves extending completely through the grating layer 30 to form spaced, parallel bars 31. The grooves between the bars 31 of the grating extend partially into the spacer layer 28.

A second clad layer 32 of p-type semiconductor material (preferably $Al_{0.34}Ga_{0.66}As$ doped with zinc to a level of $5 \times 10^{17}$ impurities/cm$^3$) is over the grating layer 30 and extends through the grooves between the bars 31 of the grating to the spacer layer 28. The second clad layer 32 has a thickness over the grating layer 30 of about 1.50 micrometers. A cap layer 34 of a n-type semiconductor material (preferably GaAs doped with selenium to a level of about $1 \times 10^{18}$ impurities/cm$^3$) is on the second clad layer 32. A highly conductive p-type conductivity contact region 36 extends through the cap layer into the second clad layer 32 directly over the channel 18. An insulating layer 38 (preferably of silicon dioxide) having a thickness of about 0.15 micrometers is over the cap layer 34. The insulating layer 38 has an opening 40 therethrough directly over the contact region 36. A conductive contact layer 42 is over the insulating layer 38 and on the contact region 36 through the opening 40. The contact layer 42 is of a material which makes good electrical contact with the p-type contact region 36. One suitable material is a tri-layer of first a film of titanium, then a film of platinum and finally a film of gold. A conductive contact layer 44 extends over the second major surface 16 of the substrate 12. The contact layer 44 is of a material which makes good electrical contact with n-type conductivity material. One suitable material is a tri-layer of first a film of a gold-germanium alloy, then a film of nickel and finally a film of gold.

To make the diode laser 10, the channel groove 18 is first etched into the first major surface 14 of the substrate 12. The first clad layer 24 is then epitaxially deposited on the first major surface 14 of the substrate and in the channel groove 18. This is done by liquid phase epitaxy (LPE) since this process not only fills the channel groove 18 but also provides the first clad layer 24 with a planar surface. The active layer 26 is then epitaxially deposited on the first clad layer 24 followed in succession by the spacer layer 28 and the grating layer 30. The active layer 26, spacer layer 28 and grating layer 30 are all also deposited by liquid phase epitaxy. The grating is then formed in the grating layer 30 using holographic and etching techniques. The grating layer 30 is etched completely therethrough and slightly into the spacer layer 28 to form the grating. The second clad layer 32 and the cap layer 34 are then epitaxially deposited in succession over the grating layer 30. These two layers are deposited by the well known metal organic chemical vapor deposition (MOCVD) technique. The insulation layer 38 is then deposited on the cap layer 34 by chemical vapor deposition and the opening 40 is formed therethrough using well known photolithographic and etching techniques. Zinc is then diffused through the opening 40 into the cap layer 34 to form the contact region 36. Finally, the conductive contacts 42 and 44 are deposited by any well known technique for depositing the metals, such as deposition in a vacuum or sputtering. In this method of making the diode laser 10, the LPE technique is used for the initial layers to achieve the filling of the channel groove 18 and the planar surface. The MOCVD technique is used for the layers over the grating to minimize problems associated with native oxide residues on the AlGaAs grating surface and meltback of the grating itself since its amplitude or height is only 500–1500 Angstroms.

The first clad layer 24 provides confinement of the optical mode to the region of the channel 18 using both an effective index step created by the change in layer thickness form the channel region to the shoulder region, and a loss mechanism by absorption of the optical mode in the shoulder region. The width of the channel 18 assures that the diode laser 10 operates in the lowest fundamental mode. The planarity, thickness, and composition of the first clad layer 24 is critical to the control of the lateral mode in this structure. The active layer 26 provides a region for the injected carriers in the device to recombine efficiently and thereby generate the light. Both the composition and thickness of the active layer 26 are critical to the manner in which the optical mode spreads to adjacent layers in the structure.

The spacer layer 28 provides confinement for carriers in the active layer 26. However, its small thickness permits the light generated in the active layer 26 to spread and interact with the grating layer 30. Both the thickness and composition of the spacer layer is important to the manner in which the light is distributed to the various layers in the structure.

The grating serves to reflect light back into the spacer layer 28 and the active layer 26. The composition and thickness of the grating layer 30 is chosen such that when it interacts with a portion of the optical mode it causes reflection of both the forward and backward waves along the longitudinal direction in the laser 10 and thereby establishes distributed feedback (DFB) operation. By etching completely through the grating layer 30 into the spacer layer 28 to form the grating, the grating height is fixed. This leads to a controlled grating coupling coefficient from device to device and from wafer to wafer. Thus, the performance characteristics of manufacturable devices is more consistent. Also, this allows the second clad layer 32 to extend between the lines of the grating. Since the second clad layer 32 is of the same material as the spacer layer 28, the grating lines are completely surrounded by the same material. Thus, the grating has the appearance of periodic wires. The periodic wire grating layer enhances grating coupling while at the same time providing a smaller cross-sectional area than a continuous layer to reduce leakage of light from the active layer 26.

The cap layer 34, which is highly conductive, serves as a current block and a contact layer. In the reverse bias mode of operation, the cap layer 34 effectively blocks the current flow everywhere except at the contact region 36 directly over the lasing region. This helps improve the efficiency of the device. The cap layer 34 as a contacting layer is important since electrical contact on an AlGaAs layer is difficult and normally leads to high resistance causing excess heating in the diode laser 10. The contact region 36 provides for good low resistance electrical contact between the contact layer 42 and the second clad layer 32 in the region over the channel 18.

The relationship of the composition and thicknesses of the active layer 26, spacer layer 28 and grating layer 30 are critical in order to achieve a small beam divergence in the range of about 25° to 29° with a nominal value of about 27°.

Figure 2:
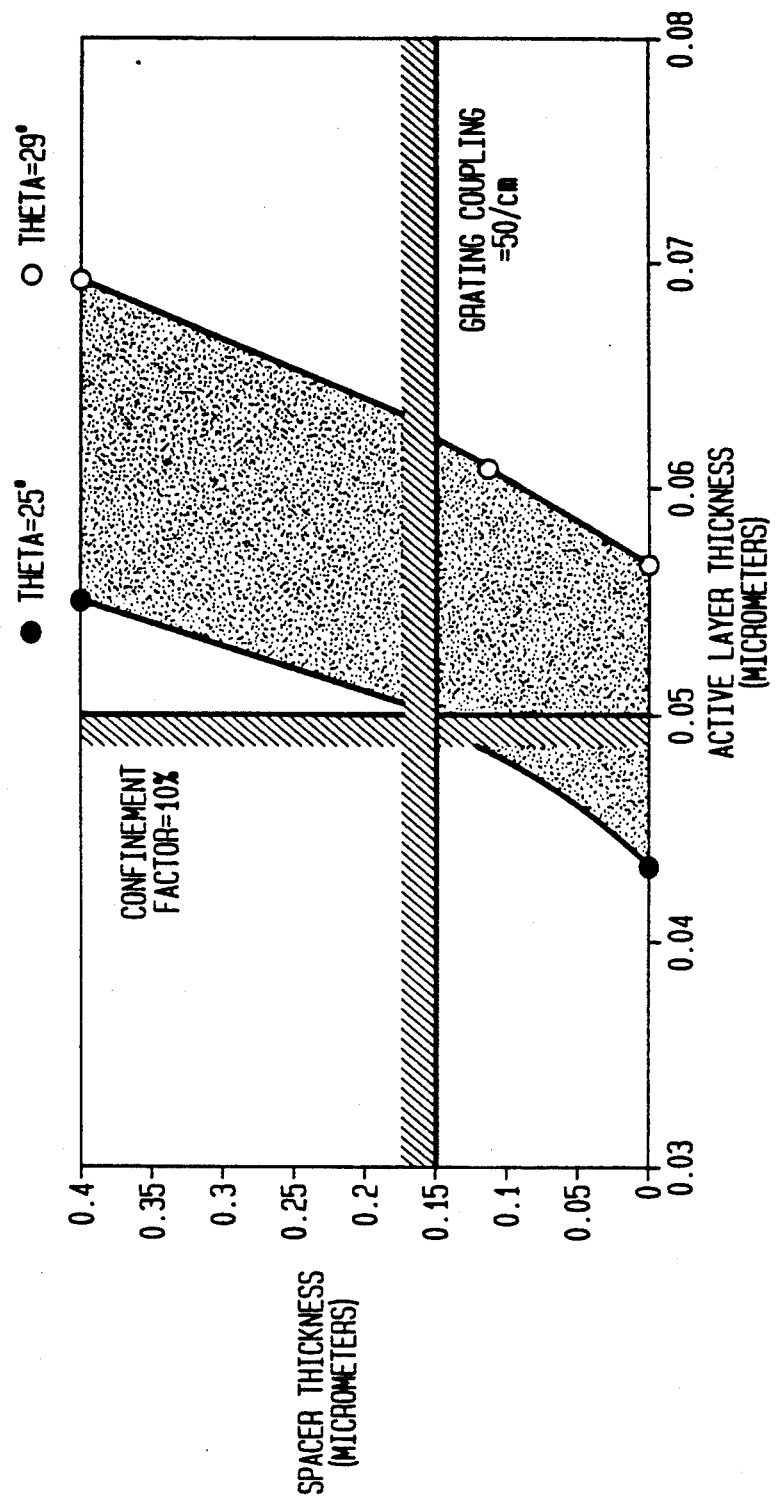
FIG. 2 is a graph showing the relation of a thicknesses of the active layer and a spacer layer of a semiconductor diode laser to achieve the semiconductor diode laser of FIG. 1.

Referring now to FIG. 2 there is shown a graph of spacer layer thickness in micrometers vs. active layer thickness micrometers. The shaded area indicates the calculated range of the thicknesses required to achieve a far-field beam divergence (theta) within the desired range of between 25° and 29°. The vertical line represents, approximately, the active layer thickness required to obtain a confinement factor of about 10%. The horizontal line represents, approximately, the spacer layer thickness required to obtain a grating coupling of 50 $cm^{-1}$. For the structure modeled here, the confinement factor is primarily a function of the thickness of the active layer. The grating coupling is primarily a function of the thickness of the spacer layer. These parameters also depend on the composition of the spacer layer and grating layer and the structure of the grating. The portion of the shaded area to the right of the vertical line and to the left of the horizontal line provides the thicknesses of the spacer layer and active layer which will provide the desired beam divergence. In the graph a confinement factor of about 10% is shown. For smaller confinement factors, the vertical line moves to the left, and for larger confinement factors, the vertical line moves to the right. In the graph a grating coupling of 50/cm was chosen which for the structure described above is achieved with a spacer layer thickness of about 0.15 micrometers. For smaller grating coupling, the horizontal line would move upwardly whereas for larger grating coupling, the horizontal line would move downwardly. Thus, depending on the characteristics desired for the diode laser 10, the thicknesses of the active layer and spacer layer can be determined for a desired beam divergence.

Thus, there is provided by the present invention a distributed feedback, channeled substrate, planar diode laser which has a relatively high output power, good spatial and spectral stability and small beam divergence.

It is to be appreciated and understood that the specific embodiment of the invention are merely illustrative of the general principles of the invention. Various modifications may be made consistent with the principles set forth. For example, as previously stated, the thicknesses of the spacer layer, active layer and grating layer may vary to achieve the desired small beam divergence as long as they are properly related to each other. Still further, the composition of the various layers may be different as long as they have the necessary band gap differences to provide confinement of carriers and light.

What is claimed is:

1. A semiconductor diode laser comprising:
   a substrate of a semiconductor material of one conductivity type having first and second opposing surfaces and a channel extending along said first surface;
   a first clad layer of a semiconductor material of the one conductivity type on said first surface of the substrate, said first clad layer filling said channel and having a planar surface;
   a thin active layer of a semiconductor material on said first clad layer;
   a spacer layer of a semiconductor material of the opposite conductivity type on said active layer;
   a grating layer of a semiconductor material of the opposite conductivity type over said spacer layer and having a grating therein which extends transversely across at least the channel in the substrate; and
   a second clad layer of a semiconductor material of the opposite conductivity type on said grating layer;
   the thickness and composition of the active layer, spacer layer, and grating layer being such as to provide a beam divergence of the light beam emitted by the diode laser in the range of about 25° to 29°.

2. The semiconductor diode laser of claim 1 wherein the first conductivity type is n-type and the opposite conductivity type is p-type, and the active layer is undoped.

3. The semiconductor diode laser of claim 2 further comprising a cap layer of a semiconductor material of the one conductivity type over the second clad layer and a contact region of the opposite conductivity type extending through said cap layer into the second clad layer, said contact region being over the channel in the substrate.

4. The semiconductor diode laser of claim 3 in which the active layer is of a thickness of between 0.05 and 0.06 micrometers and the spacer layer is of a thickness in the range of about 0.15 and 0.2 micrometers.

5. The semiconductor diode laser of claim 4 in which the clad layers, active layer and spacer layer and grating layer are of gallium aluminum arsenide with the clad layers and spacer layer having the same content of aluminum and the active layer having a lower content of aluminum than the clad layers.

6. The semiconductor diode laser of claim 5 in which the grating layer has a content of aluminum higher than that of the active layer but lower than that of the clad layers.

7. The semiconductor diode laser of claim 6 in which the grating extends completely across the grating layer.

8. The semiconductor diode laser of claim 7 in which the grating is formed of spaced grooves extending completely through the grating layer to form spaced bars of the grating layer.

9. The semiconductor diode laser of claim 8 in which the second clad layer extends through the grooves in the grating layer to the spacer layer so that the bars of the grating are completely surrounded by the second clad layer and the spacer layer.

10. The semiconductor diode laser of claim 9 in which the grating is a second order grating having a period of about 2400 Angstroms and a thickness of about 0.05 micrometers.

11. The semiconductor laser diode of claim 10 further comprising a conductive contact on the cap layer and in ohmic contact with the contact region, and a conductive contact in ohmic contact with the second surface of the substrate.

12. A semiconductor diode laser comprising:
a substrate of n-type conductivity gallium arsenide having first and second opposed major surfaces, a pair of end surfaces and a pair of side surfaces; said substrate having a channel in said first major surface extending between the end surfaces;
a first clad layer of n-type conductivity aluminum gallium arsenide on said first surface of the substrate, said first clad layer filling the channel and having a planar surface;
a thin active layer of undoped aluminum gallium arsenide having a lower content of aluminum than said first clad layer on said first clad layer;
a spacer layer of p-type conductivity aluminum gallium arsenide having the same content of aluminum as said first clad layer on said active layer;
a grating layer of p-type conductivity aluminum gallium arsenide having a content of aluminum greater than that of said active layer but less than that of said first clad layer on said spacer layer, said grating layer having a second order grating therein extending transversely across said channel in the substrate; and
a second clad layer of p-type conductivity gallium aluminum arsenide having the same content of aluminum as said first clad layer on said grating layer;
the thicknesses of the active layer, spacer layer and grating layer being such as to provide a beam divergence of the light beam emitting by the diode laser in the range of about 25° to 29°.

13. The semiconductor diode laser of claim 12 further comprising a cap layer of n-type conductivity gallium arsenide over the second clad layer and a contact region of p-type conductivity extending through the cap layer to the second clad layer.

14. The semiconductor diode laser of claim 13 in which the active layer is of a thickness of between 0.05 and 0.06 micrometers and the spacer layer is of a thickness in the range of about 0.15 and 0.2 micrometers.

15. The semiconductor diode laser of claim 14 in which the grating extends completely across the grating layer.

16. The semiconductor diode laser of claim 15 in which the grating is formed by spaced grooves extending completely through the grating layer to form spaced bars of the grating layer.

17. The semiconductor diode laser of claim 15 in which the second clad layer extends through the grooves in the grating layer to the spacer layer so that the bars of the grating are completely surrounded by the semiconductor material of the second clad layer and the spacer layer.

18. The semiconductor diode laser of claim 16 in which the grating layer has a period of about 2400 Angstroms and a thickness of about 0.05 micrometers.

19. The semiconductor diode laser of claim 17 further comprising a conductive contact on the cap layer and in ohmic contact with the contact region, and a conductive contact in ohmic contact with the second surface of the substrate.

* * * * *